United States Patent [19]

Curtis

[11] Patent Number: 4,514,704
[45] Date of Patent: Apr. 30, 1985

[54] VARIABLE FILTER CIRCUIT

[76] Inventor: Douglas R. Curtis, 110 Highland Ave., Los Gatos, Calif. 95030

[21] Appl. No.: 526,911

[22] Filed: Aug. 26, 1983

[51] Int. Cl.³ .............................................. H03F 3/04
[52] U.S. Cl. .................................. 330/305; 330/109; 330/288
[58] Field of Search ............... 330/288, 294, 304, 107, 330/109

[56] References Cited

U.S. PATENT DOCUMENTS 4,369,411 1/1983 Niimura et al. ..................... 330/288

Primary Examiner—James B. Mullins
Assistant Examiner—G. Wan
Attorney, Agent, or Firm—Thomas E. Schatzel

[57] ABSTRACT

A low-pass variable filter stage having a variable impedance circuit and may include an output buffer. The variable impedance circuit includes a transistor and a diode whose collector and anode respectively are connected to a current mirror and whose base and cathode respectively are connected to a voltage controlled current source. An external capacitor is connected across the diode to an external potential and the buffer is connected across the diode input.

A first static voltage is applied producing a first static current in the transistor collector which is mirrored into the diode anode circuit as a second static current producing a second static voltage across the diode. The sum of the static currents form a control current flowing through the current source whose amplitude controls the small signal resistance of the diode. A small signal is superimposed upon the second static current. The diode resistance, the signal frequency, and the capacitor control which frequencies pass the filter. Cascading stages with direct feed provides component reduction and electrical noise suppression while the buffer provides impedance matching to reduce filter stage loading. The capacitor connected to the external potential releases integrated circuit pin connectors for other functions.

20 Claims, 3 Drawing Figures

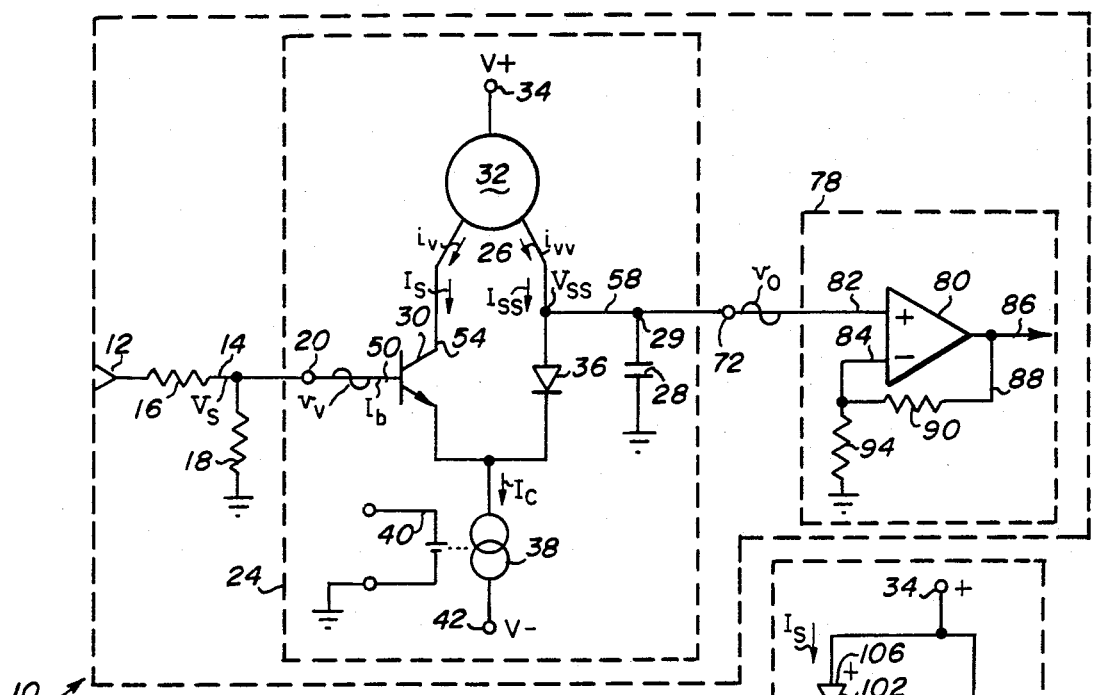
Fig_1
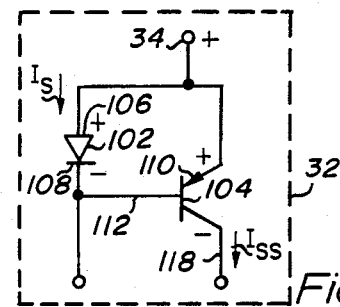
Fig_3
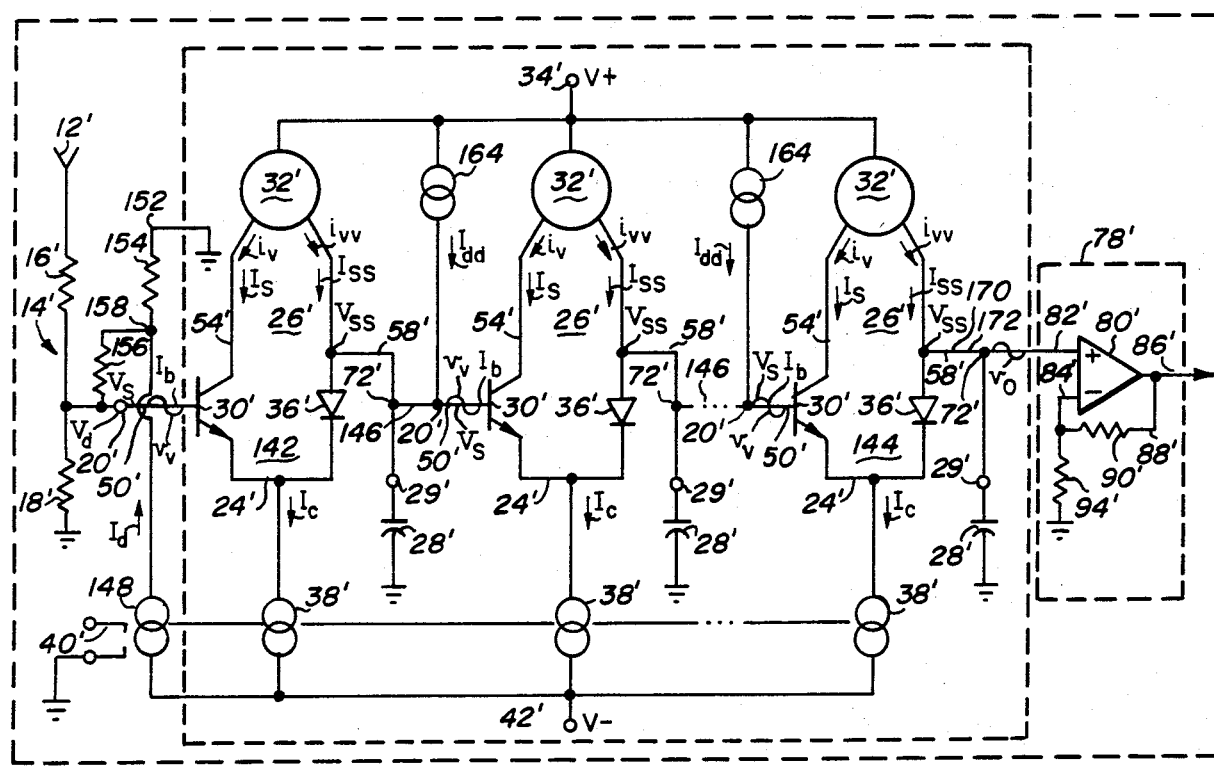
Fig_2

VARIABLE FILTER CIRCUIT

BACKGROUND OF THE INVENTION

1. Field of the Invention

The invention relates generally to electronic variable filtering circuits and more particularly to low-pass variable filter circuits for electronic musical instruments utilizing voltage controlled current sources.

2. Description of the Prior Art

Electronic filters of either the low-pass or high-pass variety are commonly used in the design of electronic musical amplifier systems. Usually these filters employ a variable filter comprised of a resistance and a capacitance, either or both of which may be variable. The cutoff frequency ($f_c$) is that frequency above or below which the filter will not pass signals, depending upon whether the filter is low-pass or high-pass. The prior art designs made the cutoff frequency ($f_c$) dependent on an external voltage applied to the filter circuit. In variable filters employed in electronic musical instruments, it is useful to control the cutoff frequency ($f_c$) of a low pass filter by using such an external voltage. In general, low pass filter design seeks to limit conduction to those frequencies below the cutoff frequency ($f_c$). Thus, a graph of signal amplitude versus frequency would illustrate all frequencies below the cutoff frequency ($f_c$) at a fixed amplitude. All frequencies above the cutoff frequency ($f_c$) would be attenuated at a rate which is frequency dependent. Every doubling of the cutoff frequency ($f_c$) is an octave and for every octave above the cutoff frequency, the amplitude of the signal will be halved if the filter is designed for a six decibel (dB) per octave roll off. This calculation is based upon the equation that decibel (dB)=20 $\text{Log}_{10}$ GAIN or 20 $\text{Log}_{10}$ amplitude out/amplitude into the filter. Thus, a filter stage designed having an amplitude attenuation of 6 dB/octave but with a very low cutoff frequency ($f_c$) might pass only the fundamental frequency. Likewise, a filter stage designed having an amplitude attenuation of 6 dB/octave but with a high cutoff frequency ($f_c$) might pass the fundamental frequency and several harmonics. An example of variable filter design is illustrated by U.S. Pat. No. 3,475,623 issued to R. A. Moog entitled "Electronic High-Pass and Low-Pass Filters Employing the Base to Emitter Diode Resistance of Bipolar Transistors". Moog employs an adder, a signal input buffer, a filter input, a filter, a filter output, a signal output buffer, and a feedback loop. The output of the adder is applied to the emitter of an input transistor to the filter. The base of the input transistor is maintained at a constant voltage by being connected to a forward biased diode and a fixed biasing voltage. The volt-ampere characteristic of the input transistor is exponential over a wide current range resulting in high current gain. The collector current which is nearly equal to the emitter current is fed to a pair of filter driver transistors connected in a push-pull common emitter configuration. The driver transistors drive a string of transistors which provide the dynamic resistance elements of the filter. The driver transistors have a very high collector-to-collector impedance so that they serve as a nearly perfect current source for the filter transistors. This defines the voltage controlled current source feeding the filter. The filter portion includes four identical sections each comprising a fixed capacitor and two transistors whose input diodes are effectively in series. Since 6 dB/octave attenuation is inadequate for music applications, four stages are cascaded to provide a cummulative attenuation of 24 dB/octave. The dynamic resistance from emitter-to-emitter of each of the filter transistor pairs is inversely proportional to the standing collector current. The cutoff frequency of each filter section is $f_c = \frac{1}{2}rc$ where "r" is the dynamic resistance of the two base-emitter diodes in series and "c" is the capacity of the emitter-to-emitter connected capacitors. At frequencies low compared to $f_c$, nearly all the signal current flows into the emitters of the filter transistors and at frequencies high compared to $f_c$, the signal is by-passed by the emitter-to-emitter capacitors.

A second example of the variable filter is disclosed by U.S. Pat. No. 3,805,091 issued to Dennis P. Colin, entitled "Frequency Sensitive Circuit Employing Variable Transconductance Circuit". Colin employs a variable transconductance means with an output fed to an operational amplifier with a feedback capacitor forming an integrator. A portion of the integrator output is fed back to the transconductance. The circuit includes a plurality of circuit gains the proper choice of which results in either high-pass, low-pass, or phase shift operation. The transconductance means includes a differential amplifier and a current reflector. The differential amplifier includes a pair of matched transistors with intercoupled emitters and connected to an expodential voltage controlled current generator which provides a control current. The current reflector includes a pair of matched transistors with their base and emitters respectively interconnected. The collectors of the current reflector transistors are connected to the cathode of a diode and the emitter of a fifth transistor, respectively. The base of the fifth transistor couples to the anode of the diode and to the collector of a first of the pair of matched transistors of the differential amplifier. The collector of the fifth transistor couples to the collector of the second of the pair of matched transistors of the differential amplifier, and to an output terminal. Thus, the circuit provides a current controlled transconductance means wherein the relationship between the output current and the input voltage is controlled by the control current. When the circuit gains are chosen to provide low-pass operation, the cutoff frequency ($f_c$) is dependent upon the control current. At higher control currents, more high frequency components of the input signal are passed and at lower control currents fewer high frequency components of the signal are passed. Since the cutoff frequency ($f_c$) of the filter is dependent upon the control current, the cutoff frequency ($f_c$) doubles for each one volt increase in the control voltage. Thus, Colin discloses a low-pass filter response whose frequency or other characteristic is controlled by an external voltage or current. The control current controls the amount of transconductance and the mathematics demonstrate a transfer function for a low-pass filter from the combination of the variable transconductance and integrator output. This design has been an industry standard.

A further example of a variable filter is illustrated by U.S. Pat. No. 3,924,199 issued to Alan R. Pearlman, entitled "N-Pole Filter Circuit Having Cascaded Filter Sections". The N-pole filter generally comprises four filter circuits cascaded in series, each filter circuit including a transconductance amplifier, an integrating amplifier, and a feedback means. A current source having four output lines coupling respectively to the transductance amplifier of each filter circuit for controlling in concert the transconductance of each of the four transconductance amplifiers. A variable and controllable signal is provided for controlling the common current source. The transductance amplifier includes a pair of input transistors with their emitters tied to a current control input terminal. A third transistor and a diode comprise a current reflector. The cutoff frequency ($f_c$) for each filter section is dependent upon a capacitor and a control current provided from a current source to the transconductance amplifier of each stage. A variable input voltage signal is coupled to a voltage-to-current converter which couples in parallel to the bases of each of four transistors providing the current source for each stage. The gain of each current source transistor is 1.0 and mirrors the control current produced by the voltage-to-current converter. Each current source produces an equal current and since the cutoff frequency ($f_c$) is dependent on the current source, each stage has an identical cutoff frequency ($f_c$). Thus, a 24 dB/octave attenuation is achieved.

A further example of an active filter is illustrated in U.S. Pat. No. 3,792,367, issued to Fleischer, et al, entitled "Active Controllable Filter Circuit Using Variable Transconductance Amplifier". Fleischer, et al teaches a filter circuit which incorporates a plurality of variable transconductance amplifiers. Two or more transconductance amplifiers are cascaded and interconnected by a feedback loop. Resistors and capacitors are selectively coupled to the input and output of the various amplifiers to provide the desired overall transfer characteristics. By selectively altering control signals supplied to the transconductance amplifiers, the overall transfer characteristic of the amplifier may be changed. In another embodiment, the transfer characteristic is altered by applying a plurality of diverse input signals to various components of the filter circuit. Thus, a variable filter is realized which is capable of being used as a sweeping bandpass filter, as an adjustable allpass (delay) section, or as a stable filter whose characteristics may be changed to compensate for temperature or time induced variations in performance.

It is desirable to integrate whole systems on a single integrated circuit chip. The variable filter designs of the prior art including the variable transconductance followed by the operational amplifier integrator or the filter employing the base to emitter diode resistance of bipolar transistors require at least four stages. Although whole systems have been integrated on a single chip a problem of the prior art is that the plurality of elements associated with the multiple stage filter cause the integrated circuit to become too large resulting in a loss of cost effectiveness. The variable filter is just one component of the whole system that must fit on the chip. Thus, space limitation on the integrated circuit chip is a major problem. The integrated circuit is placed within an integrated circuit package with a plurality of pin connectors extending therefrom. The pin connectors are used to electrically connect the functions on the chip to external circuitry. The number of pins extending from the package is always a limiting factor. The present state of the art permits only transistors, resistors, and very small capacitors to be integrated onto the chip. Thus, a large capacitor must be external to the chip and must connect to at least two pin connectors. The Moog '623 patent has four external capacitors and would require eight external pins. Thus, the number of pins available for connection to external circuitry is a limiting factor. As the cutoff frequency ($f_c$) is increased, higher frequency harmonics are permitted to pass the filter. Thus, more electrical noise passes the variable filter. Each additional transconductance stage generates additional electrical noise and the cummulative effect is to reduce the overall signal-to-noise ratio of the variable filter.

Thus, the problems of integrated circuit space limitations, the number of pin connectors as a limiting factor, and the generation of electrical noise remain in the prior art.

SUMMARY OF THE PRESENT INVENTION

It is therefore an object of the present invention to provide an improved variable filter circuit having significantly fewer components per filter stage occupying less surface area on an integrated chip.

It is a further object to provide an improved variable filter circuit capable of connecting an external capacitor to the integrated circuit using only a single pin connector.

It is a further object to provide an improved variable filter circuit capable of direct coupling of cascaded filter stages by eliminating the interstage buffer amplifier.

It is a further object to provide an improved variable filter circuit capable of reducing the accumulated electrical noise.

Briefly, a preferred embodiment of the present invention includes a variable filter stage including an attenuator leading to an input node connected to a variable impedance circuit. The variable impedance circuit includes an input transistor whose collector is connected to a current mirror. The current mirror is electrically connected to a static positive supply voltage source and the anode of a diode variable dynamic resistance. The emitter of the transistor and the cathode of the diode are electrically connected to a direct voltage controlled current source leading to a negative supply static voltage source. The voltage output of the variable impedance circuit appears across the diode which is in parallel with a fixed capacitor connected to electrical ground. The variable impedance circuit in combination with the capacitor form the variable filter stage whose output is transmitted to a high impedance input which may include a buffer. The buffer is comprised of an operational amplifier with an output partially fed back to a grounded negative input of the buffer.

A static voltage is applied to the transistor which performs a voltage-to-current conversion and feeds a first static current to the current mirror. The current mirror feeds a second static current to the anode of the diode. The summation of the first and second static currents form a static control current that flows into the current source. The control voltage controls the amplitude of the control current through the current source. A small signal is fed to the input node and the small signal resistance of the diode varies according to the amplitude of the control current while the capacitive reactance of the capacitor varies as the frequency of the small signal. The small signal is superimposed upon the first static current and is reproduced by the current mirror. The signal current flowing into the parallel resistance diode-capacitor circuit will divide between the paths according to the small signal resistance of the diode and the frequency of the signal. Since the small signal resistance of the diode is controlled by the control current and since the small signals shunted to ground are controlled by the frequency of those signals, the frequency and amplitude of the output signal developed across the diode are precisely controlled. At lower frequencies, the capacitive reactance is high and a large portion of the signal current passes through the diode creating a larger output voltage. The input impedance of the buffer greatly exceeds the output impedance of the variable filter stage and thus prevents excessive loading of the filter stage and permits driving a variety of loads.

The variable filter stage is normally cascaded in multiple stages with the output of a prior stage fed directly into a subsequent stage. The input impedance of the subsequent stage is sufficiently higher than the output impedance of the prior stage that the inter stage buffers may be eliminated. Only the buffer located after the final stage is necessary. A first compensation current source is added in the first stage input node circuitry in conjunction with a compensation resistance circuit to counteract nonlinearities associated with the current mirror of each stage. A second compensation current source is added to the input node circuitry of each stage except the first stage to counteract the minimal loading effects of the prior stage by a subsequent stage.

An advantage of the variable filter circuit of the present invention is that significantly fewer components per filter stage are required occupying less surface area on an integrated circuit.

Another advantage is that the variable filter circuit is capable of connecting an external capacitor to the integrated circuit using only a single pin connector.

A further advantage is that the variable filter circuit is capable of direct coupling of cascaded filter stages by eliminating the interstage buffer amplifier.

A further advantage is that the variable filter circuit is capable of reducing the accumulated electrical noise.

These and other objects and advantages of the present invention will no doubt become obvious to those of ordinary skill in the art after having read the following detailed description of the preferred embodiment(s) which are illustrated in the various drawing figures.

IN THE DRAWING

FIG. 1 is a circuit diagram of a variable filter circuit in accordance with the present invention;

FIG. 2 is a circuit diagram of a cascading application of the variable filter circuit of FIG. 1; and FIG. 3 is a circuit diagram of a current mirror of the variable filter circuit of FIG. 1.

DETAILED DESCRIPTION, OF THE PREFERRED EMBODIMENT

In FIG. 1, there is illustrated a low-pass variable filter circuit referred to by the general reference character 10 and incorporating the present invention. The low-pass varible filter circuit 10 passes frequencies below a cutoff frequency $f_c$ and includes an input 12, an attenuator 14 comprised of a first resistor 16 and a second resistor 18, joined at an input node 20, and a variable filter stage 24. The stage 24 includes a variable impedance circuit 26 and a fixed capacitor 28 joined at a terminal pin 29. The variable impedance circuit 26 includes an NPN transistor 30, a current mirror 32, a positive static supply voltage source 34, a variable dynamic resistance diode 36, a current source 38, a control voltage source 40, and a negative static supply voltage source 42. A quiescent base current $I_b$ flows into a base electrode 50 while a first static voltage $V_s$, typically at ground potential, and a time varying input signal $v_v$ are impressed at the base electrode 50 of transistor 30. A first static current $I_s$ flows in collector electrode 54 and a second static current $I_{ss}$ flows into a filter circuit 58 to form a second static voltage $V_{ss}$ and a control current $I_c$. Also, a first signal current $i_v$ flows in the collector electrode 54 and current mirror 32 producing a second signal current $i_{vv}$, a first portion of said second signal current $i_{vv}$, a second portion of said second signal current $i_{vv}$, and an output voltage $v_o$ appearing across an output node 72. The variable filter circuit 10 further includes a buffer 78 comprised of an operational amplifier 80, a positive input terminal 82, a negative input terminal 84, an operational amplifier output terminal 86, and a feedback loop 88 having a feedback resistor 90 joined at the terminal 84 common to a terminal of a grounding resistor 94.

The first static voltage $V_s$, which is typically zero volts, is impressed upon input node 20 via resistor 18 and the quiescent base current $I_b$ flows into the base electrode 50. The low-pass variable filter circuit 10 includes the input 12 comprised of the input node 20 and the variable filter stage 24 connected to the input node 20. The variable filter stage 24 transmits the time varying input signal $v_v$ which is below the cutoff frequency $f_c$ and the buffer 78, connected to the output of the variable filter stage 24, provides a high impedance to the output voltage $v_o$. The variable filter stage 24 comprises the transistor 30 connected to the input node 20 for providing a voltage-to-current conversion and the first static current $I_s$. The first static current $I_s$ flows in the collector electrode 54 of transistor 30 and is the quiescent base current $I_b$ amplified by the beta factor of transistor 30. The diode 36 is electrically connected to the transistor 30 and comprises the variable resistance element in the variable filter circuit 58 comprised of variable dynamic resistance diode 36 and capacitor 28. The purpose of the diode 36 is for developing the output voltage $v_o$. The current mirror 32 is electrically connected to the transistor 30 and the diode 36 for providing the second static current $I_{ss}$ which is a direct current flowing into the variable filter circuit 58. The current source 38 is also electrically connected to the transistor 30 and the diode 36 for providing the control current $I_c$ which is dependent upon the voltage of the control voltage source 40 for controlling the cutoff frequency $f_c$. The capacitor 28 is connected at one end between the current mirror 32 and the variable dynamic resistance diode 36 of the variable filter stage 24 and at the other end to an external potential which may be the ground potential. The capacitor 28 is an element of the variable filter circuit 58 for filtering the output voltage $v_o$. The diode 36 of the variable filter circuit 58 includes the second static voltage $V_{ss}$ impressed across the variable dynamic resistance diode 36. The second static voltage $V_{ss}$ is equal to the first static voltage $V_s$ at the input node 20 for any control current $I_c$.

Referring to FIG. 3, the current mirror 32 comprises a current mirror diode 102 and a current mirror transistor 104. The diode 102 has an anode 106 and a cathode 108. The transistor 104 has an emitter electrode 110, a base electrode 112 and a collector 110. The anode 106 is connected to the positive static supply voltage source 34 and the cathode 108 is negative with respect to anode 106. The current mirror diode 102 carries the first static current $I_s$ from the anode 106 to the cathode 108. The emitter electrode 110 is connected to the positive static supply voltage source 32 and the base electrode 112 is connected to the cathode 108 of the diode 102. The first static current $I_s$ creates bias voltage across the base-emitter junction of the current mirror transistor 104 for providing the second static current $I_{ss}$. For matched diode junctions the second static current $I_{ss}$ equals the first static current $I_s$ and flows from the collector electrode 118 of transistor 104. Thus, the current mirror 32 generates the second static current $I_{ss}$ equal to the first static current $I_s$ and transmits current $I_{ss}$ to diode 36.

The resistor 18 is connected between input node 20 and the first static voltage $V_s$ typically at ground potential. The purpose of resistor 16 and resistor 18 is for attenuating the time varying input signal $v_v$ to minimize distortion. The function of the variable filter circuit 10 is to pass frequencies below the cutoff frequency $f_c$. When the time varying input signal $v_v$, which may be a small alternating signal with periodic characteristics, is introduced at the input 12, the amplitude may be in volts. The design limitations of the low-pass variable filter circuit 10 permit the maximum time varying input signal $v_v$ to be within the range of 50 to 100 millivolts peak-to-peak. If the input signal $v_v$ exceeds the limit, wave distortion results due to the non-linear transfer characteristic of transistor 30. Thus, the attenuator 14 reduces the amplitude of the time varying input signal $v_v$.

The transistor 30 and the diode 36 together form the variable impedance circuit 26. The transistor 30 primarily serves as the voltage-to-current converter. The output of the transistor 30 is the first static current $I_s$ and the first signal current $i_v$. Both the first static current $I_s$ and the first signal current $i_v$ flow in the collector electrode 54 of transistor 30 which is connected to the current mirror 32. As noted, the current mirror 32 generates the second static current $I_{ss}$ and the second signal current $i_{vv}$. The control current $I_c$ comprises the summation of the first static current $I_s$ and the second static current $I_{ss}$ under static signal conditions. The second static current $I_{ss}$ varies with the first static current $I_s$ and is a direct current flowing through the diode 36 for controlling the variable impedance of the diode 36 to the time varying input signal $v_v$. The variable impedance diode 36 is in parallel with the capacitor 28 forming the variable filter circuit 58. The time varying input signal $v_v$ is introduced at the input 12 for providing the first signal current $i_v$ superimposed upon the first static current $I_s$. The first signal current $i_v$ is time varying and reflected onto the second static current $I_{ss}$ forming the second signal current $i_{vv}$ which is time varying and superimposed upon the second static current $I_{ss}$. The second signal current $i_{vv}$ flows into the variable filter circuit 58 forming the first portion of the second signal current $i_{vv}$ for flowing through the diode 36 and the second portion of the second signal current $i_{vv}$ for flowing through the capacitor 28. The first portion of the second signal current $i_{vv}$ and the second portion of the second signal current $i_{vv}$ are time varying. The amplitude of the first portion of the second signal current $i_{vv}$ is dependent upon the variable impedance of the diode 36 which forms the output voltage $v_o$ comprised of a time varying voltage which is impressed upon the buffer 78. The amplitude of the second portion of the second signal current $i_{vv}$ is dependent upon the variable impedance of the fixed capacitor 28 and the frequency of the second portion of the second signal current $i_{vv}$. The high frequencies included within the second signal current $i_{vv}$ are shunted to ground and thereby reduce the amplitude of the output voltage $v_o$. The low frequencies included within the second signal current $i_{vv}$ flow through the diode 36 increasing the amplitude of the output voltage $v_o$.

As the control current $I_c$ is varied, the amplitude of the first static current $I_s$ flowing in the collector electrode 54 of transistor 30 also varies. This variation in the first static current $I_s$ is mirrored in the second static current $I_{ss}$ by current mirror 32 which varies the resistance of diode 36. The positive static supply voltage source 34 sets the biasing condition of the transistor 30. Under static conditions, neither the time varying input signal $v_v$ nor the first signal current $i_v$ exist. The first static current $I_s$ equals the second static current $I_{ss}$, each equaling one-half the control current. The entire second static current $I_{ss}$ flows through diode 36 setting the resistance of diode 36. The first signal current $i_v$ is reflected onto the second static current $I_{ss}$ through current mirror 32 providing the second signal current $i_{vv}$. It is the second the second portion of the second signal current $i_{vv}$ that is filtered out by the capacitor 28. Under non-static conditions, the entire second static current $I_{ss}$ flows through the diode 36 and sets the resistance of diode 32. The input impedance of buffer 78 is sufficiently high to prevent any portion of the second static current $I_{ss}$ from flowing into the output node 72. The second portion of the second signal current $i_{vv}$ that is shunted to ground through capacitor 28 is dependent upon the frequency of the second signal current $i_{vv}$, the capacitance value of capacitor 28, and the impedance of diode 36 which is dependent upon the control current $I_c$. This relationship is dependent upon the familiar equation for capacitive reactance $$X_c = \frac{1}{2\pi f c} . \tag{1}$$

It is the first portion of the second signal current $i_{vv}$ that passes through diode 36 and develops the output voltage $v_o$ that is impressed upon buffer 78. The lower the frequency of the second signal current $i_{vv}$, the larger the first portion of the second signal current $i_{vv}$ appearing as the output voltage $v_o$ and impressed onto buffer 78. By varying the static control current $I_c$ and the frequency of the first signal current $i_v$, the impedance of the diode 36 and the capacitive reactance of capacitor 28 are varied and divides the second signal current $i_{vv}$ accordingly. At any given frequency, the capacitive reactance of capacitor 28 is fixed and as the control current $I_c$ is varied by the voltage of source 40 the resistance of diode 36 determines how the second signal current $i_{vv}$ is divided. The control current $I_c$ determines the amplitude of the second static current $I_{ss}$ through the diode 36 and sets the resistance of diode 36. The second signal current $i_{vv}$ is superimposed upon the second static current $I_{ss}$ and the amplitude of the second signal current $i_{vv}$ determines the output voltage $v_o$ across the diode 36. Thus, the variable filter circuit 10 controls the amplitude of the output voltage $v_o$ versus the frequency of the second signal current $i_{vv}$. At low frequencies, the output voltage $v_o$ increases, but at high frequencies, the output voltage $v_o$ decreases resulting in low-pass selective filtering.

The control current $I_c$ is a static direct current that is generated by the current source 38 and flows to the negative static supply voltage source 42. The amplitude of the control voltage source 40 applied determines the amplitude of the control current $I_c$ and also the first static current $I_s$ and second static current $I_{ss}$ that flows in the variable filter stage 24. The transistor 30, the current mirror transistor 104, the variable dynamic resistance diode 36 and the current mirror diode 102 may each be fabricated using bipolar semiconductor technology, metal oxide semiconductor technology or junction field effect semiconductor technology. The output voltage $v_o$ of the variable filter stage 24 is impressed onto the positive input 82 of the operational amplifier 80 for amplifying the output voltage $v_o$. The operational amplifier output is partially fed back to the negative input terminal 84 of the operational amplifier 80 through the feedback resistor 90 for providing a gain. The negative input terminal 84 is connected to ground through the grounding resistor 94. The output impedance of the variable filter stage 24 is high and if the load that the filter stage 24 drives has a low input impedance, the time varying input signal $v_v$ becomes excessively attenuated. The buffer 78 has a very high input impedance exceeding the output impedance of the previous variable filter stage 24. The purpose of the buffer 78 is to reduce the loading at the output node 72 by external circuits (not shown). The loading will be reduced because of the high input impedance and the low output impedance of buffer 78. This permits the buffer 78 to amplify the output voltage $v_o$ of the previous filter stage 24 and drive a plurality of loads with a wide range of input impedances. The attenuator 14 reduced the amplitude of the time varying input signal $v_v$ to accomodate the design limitations of the filter stage 24. The buffer 78 includes the feedback loop 88 for providing a gain equivalent to $$\text{Buffer Gain} = \left[ \frac{\text{Feedback Resistor } R_{90}}{\text{Grounding Resistor } R_{94}} \right] + 1. \quad (2)$$

Note that if the variable filter stage 24 is used to drive another circuit with inherently high input impedance, such as a high input impedance voltage controlled amplifier, the buffer 78 is not necessary. Under these conditions, the variable filter stage 24 operates independently to pass frequencies below the cutoff frequency $f_c$.

In the present invention, the low-pass function is formed by the variable impedance circuit 26 in combination with capacitor 28. There is no requirement for an integrator as in the prior art and the buffer 78 serves only an impedance matching function. The transfer function [T(s)] produced by the present invention for a single stage variable filter 24 is $$T(s) = \frac{1}{1 + \frac{2V_T C}{I_c} s} \quad (3)$$

and the cutoff frequency ($\omega_o = 2\pi f_c$) is represented by $$\omega_o = \frac{I_c}{2V_T C} \quad (4)$$

where $V_T = kT/q$, k=Boltzmans constant, q=magnitude of electronic charge, and T=absolute temperature. C is the value of capacitance of capacitor 28, and Ic is the magnitude of the static control current $I_c$.

Note that the variable impedance circuit 26 and the buffer 78 are each disposed on an integrated circuit (not shown). The integrated circuit includes a plurality of connection pins 29 extending therefrom. The capacitor 28 is external to the integrated circuit and is connected on one end between the current mirror 32 and the diode 36 of the variable filter stage 24. The capacitor 28 is connected on the other end to some voltage potential, typically ground potential. Note that the capacitor 28 employs only one connection pin 29 on the integrated circuit. The variable filter stage 24 reduces the number of external components tied to the integrated circuit. This reduces the overhead cost of production and allows the existing connection pins 29 to be used for other functions. The more functions that are integrated on one circuit, the greater the demand for available connection pins 29. Since capacitor 28 is connected on the external end to ground potential, a net savings of connection pins 29 results because the pin for the ground potential is required whether the external fixed capacitor is utilized or not. Since the number of available external pins 29 is always a limiting factor, the present invention contributes to a solution by requiring only one connection pin 29 per external capacitor as compared to two connection pins 29 as in the prior art.

Reduction of the number of components on an integrated circuit required to provide the low-pass function is achieved by the variable filter circuit 10. In modern designs, the low-pass variable filter circuit 10 is just one of the many components that must be placed on the chip. The net savings in components is most obvious when the plurality of the filter stages 24 are cascaded together to provide the necessary 24 decibel per octave attenuation. In FIG. 2, there is illustrated a cascaded low-pass variable filter circuit referred to by the general reference character 10'. The elements in the cascaded low-pass variable filter circuit 10' that are duplicate to those elements of the single stage low-pass variable filter circuit 10 are distinguished with a prime designation. FIG. 2 further includes a first variable filter stage 142, a final variable filter stage 144, a direct coupling 146, a first compensation current source 148, a compensation control current $I_d$, a compensation resistance circuit 152, a fifth resistance 154, a sixth resistance 156, a node 158, a static compensation voltage $V_d$, a second compensation current source 164, and a compensation static base current $I_{dd}$. The cascaded low-pass variable filter circuit 10' includes the input 12' comprising the input node 20' and the plurality of resistors including the first resistor 16' and the second resistor 18' for attenuating the time varying input signal $v_v$. The plurality of at least two variable filter stages 24' is connected to the input 12' for transmitting the time varying input signal $v_v$ which is below the cutoff frequency $f_c$. Each variable filter stage 24' comprises the transistor 30' connected to the input node 20' for providing the voltage-to-current conversion and the first static current $I_s$. The diode 36' is electrically connected to the transistor 30' and comprises the variable resistance and is an element in the variable filter circuit 58' comprised of the diode 36' and the capacitor 28'. The purpose of diode 36' is to develop an output voltage $v_o$. The current mirror 32' is electrically connected to the transistor 30' and the diode 36' and provides the second static current $I_{ss}$ which flows into the variable filter circuit 58'. The current source 38' is also electrically connected to the transistor 30' and the diode 36' and provides the control current $I_c$ for controlling the cutoff frequency $f_c$. The control current $I_c$ is proportional to the value of the control voltage source 40'. The capacitor 28' is connected on one end between the current mirror 32' and the diode 36' of the variable filter stage 24' and on the other end at the ground potential. The capacitor 28' is an element in the variable filter circuit 58' for filtering the output voltage $v_o$. Each of the variable filter stages 24' is directly coupled from the output node 72' of the variable filter stage 24' to the input node 20' of the subsequent variable filter stage 24' for minimizing electrical noise. The buffer 78' is connected to the output node 72' of the final variable filter stage 144 and provides a high impedance input to the output node 72'. The output node 72' of the final variable filter stage 144 includes the second static voltage $V_{ss}$ which is equal to the first static voltage $V_s$ located at the input node 20' of the first variable filter stage 142. In cascading, the output voltage $v_o$ of the prior filter stage 24' is fed directly into the input node 20' of the subsequent filter stage 24'. The buffer 78' is not required interstage because the input impedance of the subsequent filter stage 24' is sufficiently higher than the output impedance of the prior filter stage 24'. Thus, very little time varying input signal $v_v$ is lost due to the loading of the subsequent filter stage 24'. The result is that the subsequent filter stage 24' does not load the prior filter stage 24' and the buffer 78' is not required except following the final variable filter stage 144. Since the input impedance of the filter stage 24' equals the output impedance of the filter stage 24' multiplied by a transistor beta factor, the filter stages 24' can be directly connected together. The four filter stages 24' and the buffer 78' are ususally on the integrated circuit chip together. Since the cascaded variable filter circuit 10' is just one of several components on the integrated circuit, the elimination of buffer 78' interstage simplifies the design and reduces the number of components. Each additional filter stage 24' generates electrical noise and if the cutoff frequency $f_c$ is set at the upper limit of the human audio band, additional electrical noise appears at the output voltage $v_o$. By reducing the number of buffers 78', less electrical noise is accumulated resulting in a greater signal-to-noise ratio. As in the single filter stage 24 design, if the final variable filter stage 144 is used to drive a high impedance load, the buffer 78' is not necessary.

The transfer function for an "N" stage cascaded low-pass variable filter circuit 10' is $$T(s) = \frac{K}{\left[\frac{2V_T C}{I_c} S + 1\right]^N} \quad (5)$$

where $V_T = kT/q$, c = valve of capacitor 28', $I_c$ = magnitude of the control current $I_c$, and K is a constant of proportionality.

Certain imperfections of the second order exist in the present invention. The imperfections include the small non-linearity of the current mirror 32' and the minimal interstage loading of the filter stages 24'. The first compensation current source 148 is located in the first variable filter stage 142 and is connected to the current source 38' of each of the plurality of the variable filter stages 24'. The first compensation current source 148 provides the compensation control current $I_d$ which is equal to the control current $I_c$ of each of the plurality of the variable filter stages 24'. The first compensation current source 148 acts in combination with the compensation resistance circuit 152. The compensation resistance circuit 152 is comprised of the fifth resistance 154 and the sixth resistance 156. The fifth resistance 154 is connected between the first compensation current source 148 and the ground potential and the sixth resistance 156 is connected between the node 158 and the input node 20'. The node 158 is located between the first compensation current source 148 and the fifth resistance 154. The compensation resistance circuit 152 provides the static compensation voltage $V_d$ to the base electrode 50' of the transistor 30' of the first variable filter stage 24'. The static compensation voltage $V_d$ is attenuated by the compensation resistance circuit 152 and is proportional to the compensation control current $I_d$. The static compensation voltage $V_d$ is equal to and oppositely polarized to a first error 170 in the second static voltage $V_{ss}$ located at the final variable filter stage 144. Under static conditions with no time varying input signal $v_v$, the second static voltage $V_{ss}$, which is a direct current quiescent voltage, equals the first static voltage $V_s$. This is true because the emitter-base junction of the transistor 30' is matched to the junction area of the diode 36'. Since the second static current $I_{ss}$ is the duplicate of the first static current $I_s$ then the voltage drops through the transistor 30' and the diode 36' will be identical. Thus, under normal static conditions, the first static voltage $V_s$ at the input node 20' is equal to the second static voltage $V_{ss}$ at the output node 72' and so any direct current voltage applied to the input node 20' of the filter stage 24 is preserved at the output node 72' of the diode 36'. The current mirror 32' has a one-to-one ratio input to output but when integrated on a chip utilizing control currents $I_c$ exceeding 300 to 400 microamps, the current mirror 32' begins to loss accuracy. The second static current $I_{ss}$ may be unequal to the first static current $I_s$ resulting in differing voltage drops. The input node 20' of the first variable filter stage 142 is grounded through the second resistor 18' and is at approximately ground potential. Without the time varying input signal $v_v$, the voltage at the base electrode 50' is approximately zero regardless of the magnitude of the control current $I_c$. When small control currents $I_c$ increase in magnitude, the voltage drop across the diode 36' tracks the base-emitter voltage drop across the transistor 30' and the first static voltage $V_s$ remains equal to the second static voltage $V_{ss}$. However, an increase in control current $I_c$ above 400 micro amps causes the second static current $I_{ss}$ provided by the current mirror 32' to not equal the first static current $I_s$ due to the non-linearity of the current mirror 32' as illustrated in FIG. 3. Thus, the second static voltage $V_{ss}$ at the output node 72' is no longer at the ground potential as is the first static voltage $V_s$ located at the input node 20'. It is undesirable for the second static voltage $V_{ss}$ to shift with respect to the first static voltage $V_s$ due to the imperfect current mirror 32' as the control current $I_c$ is varied. To combat this problem, the first compensation current source 148 in combination with the compensation resistance circuit 152 is added to the first filter stage 142 only. The first compensation current source 148 tracks the current sources 38' such that the compensation control current $I_d$ is proportional to the control current $I_c$. The compensation control current $I_d$ creates a direct current voltage drop across the fifth resistance 154 between the node 158 and ground potential proportional to the compensation control current $I_d$ and the first static current $I_s$. A small portion of this direct current voltage, which is the static compensation voltage $V_d$, is impressed across the base electrode 50' of transistor 30' of the first filter stage 142 through the sixth resistance 156. By adding the first compensation current source 148, the static compensation voltage $V_d$ proportional to the compensation control current $I_d$ is fed to the first filter stage 142. The static compensation voltage $V_d$ fed to the input node 20' causes a corresponding change in output voltage $v_o$ which opposes the inaccuracy in output voltage $v_o$ caused by the current mirror 32'. If the values of the fifth resistance 154 and the sixth resistance 156 are properly selected, the static compensation voltage $V_d$ will cancel the effect of the inaccuracy of the current mirror 32' on the output voltage $v_o$. In the cascaded variable filter circuit 10', all the transistors 30' and diodes 36' on the integrated circuit are matched so that the inaccuracy or shift in the output voltage $v_o$ caused by the current mirror 32' of each filter stage 24' is identical. The total differential shift in output voltage $v_o$ is the cumulative sum of the shift of each filter stage 24'. The cumulative shift produces the first error 170 appearing at the final filter stage 144. The static compensation voltage $V_d$ at the input node 20' of the first filter stage 142 is adjusted to compensate for the cumulative first error 170 so that the second static voltage $V_{ss}$ is at ground potential when the first static voltage $V_s$ is at ground potential. Thus, if each filter stage 24' of the four stage variable filter circuit 10' produced a 10 millivolt error as the control current $I_c$ is increased, the first error 170 at the final filter stage 144 would be +40 millivolts. The compensation control current $I_d$ would produce a −40 millivolt direct current voltage which is the static compensation voltage $V_d$ applied at the input node 20'. The fifth resistance 154 converts the compensation control current $I_d$ into the static compensation voltage $V_d$. The second resistance 18' and the sixth resistance 156 form an attenuator for the static compensation voltage $V_d$.

When bipolar transistors 30' are used in the cascaded variable filter circuit 10', each bipolar transistor needs quiescent base current $I_b$ to operate properly. That quiescent base current $I_b$ comes from the second static current $I_{ss}$ of the prior filter stage 24'. This causes the second static current $I_{ss}$ to be of lower magnitude than the first static current $I_s$. Because the base-emitter junction of transistor 30' is matched to the junction diode 36', unequal currents flowing through each will produce uneven static and signal voltage drops across the transistor 30' and the diode 36'. Thus, the second static voltage $V_{ss}$ is no longer equal to the first static voltage $V_s$. This voltage difference appears at the output node 72' and could disrupt external circuits (not shown) driven by the output voltage $v_o$. Because the first static current $I_s$ and the second static current $I_{ss}$ are normally equal and sum to produce the control current $I_c$, then the second static current $I_{ss}$ equals half the control current $I_c$. Half the control current $I_c$, which equals the current in collector electrode 54', is equal to the base current $I_b$ multiplied by the transistor beta factor. Thus, the base current $I_b$ drawn into the subsequent filter stage 24' is equal to one half the control current $I_c$ of the prior filter stage 24' divided by the transistor beta factor of the matched transistors 30'. Note that this base current $I_b$ is less than 1% of the control current $I_c$ flowing through the prior filter stage 24'. Thus, the static control current $I_c$ divided by two beta factor flowing into the subsequent filter stage 24' causes the same problem as the nonlinear current mirrors 32'. The second static current $I_{ss}$ through the diode 36' is not equal to the first static current $I_s$ through transistor 30' of the prior filter stage 24' resulting in a small discrepancy or second error 172 in the second static voltage $V_{ss}$ compared to the first static voltage $V_s$. The direct current voltage second error 172 exists between the input node 20' and the output node 72' of the same filter stage 24'. The second compensation current source 164 is connected between the positive static supply voltage source 34' and the base electrode 50' of each of the plurality of variable filter stages 24' except the first variable filter stage 142. The second compensation current source 164 provides the compensation static base current $I_{dd}$ to the base electrode 50' of each of the plurality of variable filter stages 24' except the first variable filter stage 142. The compensation static base current $I_{dd}$ is equal to and replaces the second static current $I_{ss}$ of the prior variable filter stage 24' divided by the transistor beta factor of the subsequent variable filter stage 24'. The compensation static base current $I_{dd}$ opposes the second error 172 in the second static voltage $V_{ss}$ of the final variable filter stage 144. If the subsequent filter stage 24' is supplied with the base current $I_b$ for transistor 30' from the second compensation current source 164, the control current $I_c$ divided by two beta factor will not be drawn from the prior filter stage 24'. Then, all of the second static current $I_{ss}$, which equals one half the control current $I_c$ of the prior filter stage 24', will flow through diode 36'. Then the first static current $I_s$ will equal the second static current $I_{ss}$ causing the first static voltage $V_s$ to equal the second static voltage $V_{ss}$. Then, the voltage at the input node 20' will equal the output voltage $v_o$ at the output node 72'. The second compensation current source 164 is not added to the input node 20' of the first filter stage 142 because the second resistance 18' is small and the base current $I_b$ of the first stage would produce a very small static voltage drop. This voltage drop across the second resistor 18' would not affect the first static voltage $V_s$ appreciably.

Although the present invention has been described in terms of the presently preferred embodiment(s), it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A low-pass variable filter circuit comprising, in combination:

an input terminal means coupled to an input node;

a variable filter stage means connected to said input node for transmitting a time varying input signal below a cutoff frequency to an output of the variable filter stage means, said variable filter stage means comprising a transistor connected to said input node for providing a voltage-to-current conversion and a first static current, a variable dynamic resistance diode for developing an output signal and electrically connected to said transistor and being an element in a resistance diode-capacitance network;

a current mirror electrically connected to said transistor and said variable dynamic resistance diode for providing a second static current for flowing into said resistance diode-capacitance network;

a current source electrically connected to said transistor and said variable dynamic resistance diode for providing a control current dependent upon a control voltage, said control current for controlling the cutoff frequency;

a capacitor connected between said current mirror and said variable dynamic resistance diode of the variable filter stage means and a first external potential, said capacitor being an element in said resistance diode-capacitance network for filtering said output signal; and an output node connected to said capacitor for receiving said output signal.

2. The variable filter circuit of claim 1 wherein said current mirror comprises at least one current mirror diode and at least one current mirror transistor, said current mirror diode including an anode connected to a positive voltage and a cathode being negative with respect to said anode and carrying said first static current from said anode to said cathode, said current mirror transistor comprised of an emitter electrode connected to said positive voltage and a base electrode connected to said cathode of said current mirror diode, wherein said first static current creates a bias voltage across a junction comprised of said base and said emitter of said current mirror transistor for providing said second static current, said second static current being substantially equal to said first static current and flowing from a collector electrode of said current mirror transistor.

3. The variable filter circuit of claim 1 wherein a first resistance is connected between the input terminal means and said input node and a second resistance is connected between said input node and a second external potential, said first and second resistances being connected for attenuating said time varying input signal to minimize distortion in said output signal.

4. The variable filter circuit of claim 1 further including a buffer connected to said output node of the variable filter stage means for providing a high impedance to said output node.

5. The variable filter circuit of claim 4 wherein said buffer comprises an operational amplifier including a positive input terminal, a negative input terminal, and an output terminal, such that said output signal of the variable filter stage can flow into said positive input terminal for amplifying said output signal, said output terminal of the operational amplifier being coupled to the negative input terminal to partially feed back said output signal to said negative input terminal through a feedback resistance, said negative input terminal being coupled to a third external potential through a grounding resistance.

6. The variable filter circuit of claim 4 wherein the variable impedance circuit and the buffer are each disposed on an integrated circuit.

7. The variable filter circuit of claim 6 further including a plurality of connection pins extending from said integrated circuit, said capacitor being connected between said current mirror and said variable dynamic resistance diode of the variable filter stage and said first external potential employing only one of said plurality of connection pins.

8. The variable filter circuit of claim 4 wherein said control current comprises the summation of said first static current and said second static current under static signal conditions wherein said second static current varying with said first static current, said second static current being a direct current flowing through said diode for controlling the variable dynamic resistance of said diode to said time varying input signal, said variable dynamic resistance diode being in parallel with said capacitor forming said resistance diode-capacitance network, and wherein said time varying input signal being introduced at said input for providing a first signal current superimposed upon said first static current, said first signal current being time varying and reflected onto said second static current forming a second signal current being time varying and superimposed upon said second static current, said second signal current flowing into said resistance diode-capacitance network forming a first portion of said second signal current for flowing through said variable dynamic resistance diode and a second portion of said second signal current for flowing through said capacitor, said first portion of said second signal current and said second portion of said second signal current being time varying, the amplitude of said first portion of said second signal current being dependent upon said variable dynamic resistance of said diode forming said output signal comprising a time varying voltage and impressed upon the buffer and the amplitude of said second portion of said second signal current being dependent upon the variable impedance of said capacitor comprising a fixed capacitance and the frequency of said second portion of said second signal current, wherein high frequencies being shunted to said first external potential reduce said amplitude of said output signal and low frequencies flowing through said variable dynamic resistance diode increase said amplitude of said output signal.

9. The variable filter circuit of claim 1 wherein said transistor of the variable filter stage is selected from the group consisting of bipolar transistors, metal oxide semiconductor field effect transistors and junction field effect transistors.

10. The variable filter circuit of claim 2 wherein said current mirror transistor of the variable filter stage is selected from the group consisting of bipolar transistors, metal oxide semiconductor field effect transistors and junction field effect transistors.

11. The variable filter circuit of claim 1 wherein said variable dynamic resistance diode of the variable filter stage is selected from the group consisting of bipolar diodes, metal oxide semiconductor field effect diodes and junction field effect diodes.

12. The variable filter circuit of claim 2 wherein said current mirror diode of the variable filter stage is selected from the group consisting of bipolar diodes, metal oxide semiconductor field effect diodes and junction field effect diodes.

13. A cascaded low-pass variable filter circuit comprising, in combination:

an input terminal means coupled to an input node and a plurality of resistors for attenuating a time varying input signal;

a plurality of at least two variable filter stages connected to said input terminal means for transmitting said time varying input signal below a cutoff frequency, each variable filter stage comprising a transistor connected to said input node for providing a voltage-to-current conversion and a first static current, a variable dynamic resistance diode for developing an output signal electrically connected to said transistor and being an element in a resistance diode-capacitance network, a current mirror electrically connected to said transistor and said variable dynamic resistance diode for providing a second static current for flowing into said resistance diode-capacitance network, a current source electrically connected to said transistor and said variable dynamic resistance diode for providing a control current dependent upon a control voltage, said control current for controlling the cutoff frequency, a capacitor connected between said current mirror and said variable dynamic resistance diode of the variable filter stage and a first external potential and being an element in said resistance diode-capacitance network for filtering said output signal, each variable filter stage being directly coupled from an output node of said variable filter stage to said input node of a subsequent variable filter stage for receiving said output signal and for minimizing electrical noise.

14. The variable filter circuit of claim 13 further including a buffer connected to said output node of a final variable filter stage for providing a high impedance to said output node.

15. The cascaded low-pass variable filter circuit of claim 13, further including a first compensation current source located in said first variable filter stage and connected to said current source of each of the plurality of variable filter stages for providing a compensation control current proportional to said control current of each of the plurality of variable filter stages, said first compensation current source in combination with a compensation resistance means for providing a static compensation voltage to a base electrode of said transistor of the first variable filter stage, said static compensation voltage being proportional to said compensation control current and oppositely polarized for opposing a first error in said second static voltage of said final variable filter stage.

16. The cascaded low-pass variable filter circuit of claim 13 further including a second compensation current source electrically connected to said base electrode of each of the plurality of variable filter stages except said first variable filter stage for providing a compensation static base current to said base electrode of each of the plurality of variable filter stages except said first variable filter stage, said compensation static base current being equal to and replacing said second static current of a prior variable filter stage divided by a transistor beta factor of said subsequent variable filter stage, said compensation static base current for opposing a second error in said second static voltage of said final variable filter stage.

17. The cascaded low-pass variable filter circuit of claim 13 wherein said transistor of the variable filter stage is selected from the group consisting of bipolar transistors, metal oxide semiconductor field effect transistors and junction field effect transistors.

18. The cascaded low-pass variable filter circuit of claim 13 wherein said current mirror transistor of the variable filter stage is selected from the group consisting of bipolar transistors, metal oxide semiconductor field effect transistors and junction field effect transistors.

19. The cascaded low-pass variable filter circuit of claim 13 wherein said variable dynamic resistance diode of the variable filter stage is selected from the group consisting of bipolar diodes, metal oxide semiconductor field effect diodes and junction field effect diodes.

20. The cascaded low-pass variable filter circuit of claim 13 wherein said current mirror diode of the variable filter stage is selected from the group consisting of bipolar diodes, metal oxide semiconductor field effect diodes and junction field effect diodes.

* * * * *